(12) United States Patent
Ramsey et al.

(10) Patent No.: US 7,283,255 B2
(45) Date of Patent: Oct. 16, 2007

(54) WIRELESS SUBSTRATE-LIKE SENSOR

(75) Inventors: Craig C. Ramsey, West Linn, OR (US); Jeffrey K. Lassahn, Portland, OR (US); Greg Huntzinger, West Linn, OR (US); DelRae H. Gardner, Tualatin, OR (US)

(73) Assignee: CyberOptics Semiconductor, Inc., Beaverton, OR (US)

( * ) Notice: Subject to any disclaimer, the term of this patent is extended or adjusted under 35 U.S.C. 154(b) by 0 days.

(21) Appl. No.: 11/364,972

(22) Filed: Mar. 1, 2006

(65) Prior Publication Data

US 2006/0151606 A1 Jul. 13, 2006

Related U.S. Application Data

(62) Division of application No. 10/356,684, filed on Jan. 31, 2003.

(60) Provisional application No. 60/354,551, filed on Feb. 6, 2002.

(51) Int. Cl.
*G01B 11/14* (2006.01)
(52) U.S. Cl. ............ 356/620; 356/614
(58) Field of Classification Search ........... None
See application file for complete search history.

(56) References Cited

U.S. PATENT DOCUMENTS

| | | | |
|---|---|---|---|
| 3,876,833 A | 4/1975 | Broers et al. | 250/492 |
| 4,074,114 A | 2/1978 | Dobras | 235/462.07 |
| 4,119,381 A | 10/1978 | Muka et al. | 356/244 |
| 4,180,199 A | 12/1979 | O'Rourke et al. | 228/102 |
| 4,701,096 A | 10/1987 | Fisher | 414/416.08 |
| 4,753,569 A | 6/1988 | Pryor | 414/730 |
| 4,791,482 A | 12/1988 | Barry et al. | 348/136 |
| 4,843,287 A | 6/1989 | Taft | 318/568.16 |
| 5,175,601 A | 12/1992 | Fitts | 356/604 |
| 5,232,331 A | 8/1993 | Kasai et al. | 414/802 |
| 5,265,957 A | 11/1993 | Moslehi et al. | 374/1 |

(Continued)

FOREIGN PATENT DOCUMENTS

DE 101065774 A1 8/2001

(Continued)

OTHER PUBLICATIONS

International Preliminary Examination Report from Internatinal Application No. PCT/US03/03247, filed Feb. 4, 2003.

(Continued)

*Primary Examiner*—Gregory J. Toatley, Jr.
*Assistant Examiner*—Gordon J. Stock, Jr.
(74) *Attorney, Agent, or Firm*—Westman, Champlin & Kelly, P.A.

(57) ABSTRACT

A wireless substrate-like sensor is provided to facilitate alignment and calibration of semiconductor processing systems. The wireless substrate-like sensor includes an optical image acquisition system that acquires one or more images of targets placed within the semiconductor processing system. Analysis of images of the targets obtained by the wireless substrate-like sensor provides position and/or orientation information in at least three degrees of freedom. An additional target is affixed to a known location within the semiconductor processing system such that imaging the reference position with the wireless substrate-like sensor allows the measurement and compensation for pick-up errors.

20 Claims, 7 Drawing Sheets

U.S. PATENT DOCUMENTS

| | | | | |
|---|---|---|---|---|
| 5,267,143 | A | * | 11/1993 | Pryor ............................ 700/56 |
| 5,298,368 | A | | 3/1994 | Merkel ......................... 430/296 |
| 5,301,248 | A | | 4/1994 | Takanori et al. ............. 382/147 |
| 5,321,989 | A | | 6/1994 | Zimmer et al. ................ 73/724 |
| 5,435,682 | A | | 7/1995 | Crabb et al. ................. 414/217 |
| 5,444,637 | A | | 8/1995 | Smesny et al. .............. 364/556 |
| 5,521,123 | A | | 5/1996 | Komatsu et al. ............. 437/209 |
| 5,573,728 | A | | 11/1996 | Loesch et al. .................. 422/90 |
| 5,619,027 | A | | 4/1997 | Ackley ................... 235/462.01 |
| 5,642,293 | A | * | 6/1997 | Manthey et al. ............... 702/42 |
| 5,675,396 | A | | 10/1997 | Tsunehiro ..................... 349/59 |
| 5,721,677 | A | | 2/1998 | Pryor ............................ 700/61 |
| 5,726,066 | A | | 3/1998 | Choi ............................... 437/3 |
| 5,742,702 | A | * | 4/1998 | Oki ............................. 382/156 |
| 5,783,341 | A | | 7/1998 | Uzawa ........................... 430/22 |
| 5,786,704 | A | | 7/1998 | Kim ............................. 324/765 |
| 5,805,289 | A | * | 9/1998 | Corby et al. ................. 356/614 |
| 5,956,417 | A | | 9/1999 | Pryor .......................... 382/154 |
| 5,962,909 | A | | 10/1999 | Jerominek et al. ........... 257/522 |
| 5,969,639 | A | | 10/1999 | Lauf et al. .............. 340/870.17 |
| 5,973,788 | A | * | 10/1999 | Pettersen et al. ............ 356/614 |
| 5,981,116 | A | | 11/1999 | Ota ............................... 430/22 |
| 6,010,009 | A | | 1/2000 | Peterson et al. ............. 206/711 |
| 6,013,236 | A | | 1/2000 | Takahashi et al. ........... 423/345 |
| 6,022,811 | A | | 2/2000 | Yuuki et al. ................. 438/758 |
| 6,075,909 | A | | 6/2000 | Ressl ............................ 385/14 |
| 6,106,457 | A | | 8/2000 | Perkins et al. .............. 600/175 |
| 6,129,278 | A | | 10/2000 | Wang et al. ............ 235/462.01 |
| 6,175,124 | B1 | | 1/2001 | Cole et al. ..................... 257/48 |
| 6,206,441 | B1 | | 3/2001 | Wen et al. ..................... 294/1.1 |
| 6,232,615 | B1 | * | 5/2001 | Van Empel ................. 250/548 |
| 6,244,121 | B1 | | 6/2001 | Hunter ....................... 73/865.9 |
| 6,275,742 | B1 | | 8/2001 | Sagues et al. ............... 700/213 |
| 6,300,974 | B1 | | 10/2001 | Viala et al. .................... 348/61 |
| 6,325,356 | B1 | | 12/2001 | Rozenblatt ................... 374/161 |
| 6,325,536 | B1 | | 12/2001 | Renken et al. .............. 374/161 |
| 6,326,228 | B1 | | 12/2001 | Hughes et al. ................ 438/49 |
| 6,389,158 | B1 | | 5/2002 | Pettersen et al. ........... 382/154 |
| 6,466,325 | B1 | * | 10/2002 | Gooch ......................... 356/620 |
| 6,468,816 | B2 | | 10/2002 | Hunter ......................... 438/14 |
| 6,476,825 | B1 | * | 11/2002 | Croy et al. .................. 715/716 |
| 6,480,537 | B1 | | 11/2002 | Agrawal et al. ............. 375/240 |
| 6,526,668 | B1 | | 3/2003 | Beckhart et al. ......... 33/366.11 |
| 6,532,403 | B2 | | 3/2003 | Beckhart et al. ............ 700/254 |
| 6,535,650 | B1 | | 3/2003 | Poulo et al. ................. 382/284 |
| 6,607,951 | B2 | * | 8/2003 | Chen et al. .................. 438/199 |
| 6,625,305 | B1 | | 9/2003 | Keren ......................... 382/162 |
| 6,628,803 | B1 | * | 9/2003 | Wakashiro et al. .......... 382/103 |
| 6,681,151 | B1 | * | 1/2004 | Weinzimmer et al. ....... 700/259 |
| 6,691,068 | B1 | | 2/2004 | Freed et al. ................. 702/187 |
| 6,734,027 | B2 | | 5/2004 | Jonkers ......................... 438/14 |
| 6,801,257 | B2 | | 10/2004 | Segev et al. ................. 348/296 |
| 6,836,212 | B2 | * | 12/2004 | Sawinski ................ 340/539.23 |
| 6,852,975 | B2 | | 2/2005 | Riegl et al. .................. 250/334 |
| 6,925,356 | B2 | | 8/2005 | Schauer et al. ............. 700/213 |
| 6,958,768 | B1 | | 10/2005 | Rao et al. ..................... 348/86 |
| 6,966,235 | B1 | | 11/2005 | Paton ......................... 73/865.9 |
| 6,985,169 | B1 | | 1/2006 | Deng et al. .................... 348/61 |
| 6,990,215 | B1 | * | 1/2006 | Brown et al. ................ 382/106 |
| 7,035,913 | B2 | | 4/2006 | Culp et al. ................... 709/218 |
| 7,135,852 | B2 | | 11/2006 | Renken et al. ............ 324/158.1 |
| 7,149,643 | B2 | | 12/2006 | Renken et al. .............. 702/122 |
| 7,158,857 | B2 | | 1/2007 | Schauer et al. ............. 700/218 |
| 7,180,607 | B2 | | 2/2007 | Kyle et al. ................... 356/614 |
| 7,206,080 | B2 | | 4/2007 | Kochi et al. ................. 356/611 |
| 2001/0050769 | A1 | | 12/2001 | Fujinaka ..................... 356/121 |
| 2002/0006675 | A1 | | 1/2002 | Shigaraki ......................... 438/4 |
| 2002/0028629 | A1 | * | 3/2002 | Moore ............................ 451/6 |
| 2002/0078770 | A1 | * | 6/2002 | Hunter ....................... 73/865.9 |
| 2002/0092369 | A1 | * | 7/2002 | Hunter ....................... 73/865.9 |
| 2002/0101508 | A1 | * | 8/2002 | Pollack .......................... 348/85 |
| 2002/0148307 | A1 | | 10/2002 | Jonkers ...................... 73/865.9 |
| 2003/0001083 | A1 | * | 1/2003 | Corrado et al. ............. 250/239 |
| 2003/0112448 | A1 | | 6/2003 | Maidhof et al. ............. 356/603 |
| 2003/0127589 | A1 | | 7/2003 | Corrado et al. ............. 250/239 |
| 2003/0160883 | A1 | | 8/2003 | Ariel et al. .................. 348/308 |
| 2003/0209097 | A1 | | 11/2003 | Hunter ....................... 73/865.9 |
| 2003/0223057 | A1 | | 12/2003 | Ramsey et al. .............. 356/147 |

FOREIGN PATENT DOCUMENTS

| | | |
|---|---|---|
| EP | 0583007 B1 | 10/1997 |
| EP | 1150187 A2 | 10/2001 |
| EP | 1184805 A1 | 3/2002 |
| JP | 01082823 | 9/1987 |
| JP | 62054108 | 9/1987 |
| JP | 3214783 A2 | 9/1991 |
| JP | 06163340 | 11/1992 |
| JP | 06076193 | 6/1993 |
| JP | 7074229 | 6/1993 |
| JP | 163340 | 6/1994 |
| JP | 7280644 A2 | 10/1995 |
| JP | 8233855 A2 | 9/1996 |
| JP | 11307606 | 4/1998 |
| JP | 11260706 | 9/1999 |
| JP | 2004-276151 | 10/2004 |
| WO | WO 00/12263 | 3/2000 |
| WO | WO 00/70495 | 11/2000 |
| WO | WO0165317 A2 | 9/2001 |
| WO | WO 01/88976 | 11/2001 |
| WO | WO 02/17364 | 2/2002 |
| WO | WO 02/29385 | 4/2002 |
| WO | WO 02/47115 | 6/2002 |
| WO | WO 03/060989 A1 | 7/2003 |

OTHER PUBLICATIONS

Invitation to Pay Fees from International Application No. PCT/US2005/007656, filed Mar. 3, 2005.

International Search Report from International Application No. PCT/US2005/007418, filed Mar. 9, 2005.

International Preliminary Examination Report from International Application No. PCT/US2005/007423, filed Mar. 9, 2005.

International Preliminary Examination Report and Written Opinion from International Application No. PCT/US2005/007656, filed Mar. 9, 2005.

U.S. Appl. No. 10/356,684, filed Jan. 31, 2003, Ramsey et al.

Notification of Transmittal of the International Preliminary Report from International Application No. PCT/US05/007423, filed Mar. 9, 2005; Copy of Notification of Transmittal of the International Search Report and Written Opinion from International Application No. PCT/US05/007423, filed Mar. 9, 2005.

Notification of Transmittal of the International Search Report and Written Opinion from International Application No. PCT/US05/007656, filed Mar. 9, 2005; Copy of Notification of Transmittal of the International Preliminary Report on Patentability from International Application No. PCT/US05/007656, filed Mar. 9, 2005.

Notification of Transmittal of International Preliminary Examination Report from International Application No. PCT/US05/007418, filed Mar. 9, 2005; Copy of Notification of the International Search Report and Written Opinion from International Application No. PCT/US05/007418, filed Mar. 9, 2005.

"Final Report on Wireless Wafer Proof-of-Principle," J.B. Wilgen, et al., Oak Ridge National Laboratory, Jan. 18, 1998.

"Autonomous Micro-sensor Arrays for Process Control of Semiconductor Manufacturing Processes," Darin Fisher, et al., Jun. 4, 1998.

NSF Award Abstact—#9628420, https://www.fastlane.nsf.gov/servlet/showaward?award=9628420, no date.

* cited by examiner

WIRELESS SUBSTRATE-LIKE SENSOR

CROSS-REFERENCE OF CO-PENDING APPLICATIONS

The present application is a divisional of and claims priority of U.S. patent application Ser. No. 10/356,684, filed Jan. 31, 2003, which application claims priority to previously filed provisional application Ser. No. 60/354,551, filed Feb. 6, 2002, entitled WAFER-LIKE SENSOR.

BACKGROUND OF THE INVENTION

Semiconductor processing systems are characterized by extremely clean environments and extremely precise semiconductor wafer movement. Industries place extensive reliance upon high-precision robotic systems to move substrates, such as semiconductor wafers, about the various processing stations within a semiconductor processing system with the requisite precision.

Reliable and efficient operation of such robotic systems depends on precise positioning, alignment, and/or parallelism of the components. Accurate wafer location minimizes the chance that a wafer may accidentally scrape against the walls of a wafer processing system. Accurate wafer location on a process pedestal in a process chamber may be required in order to optimize the yield of that process. Precise parallelism between surfaces within the semiconductor processing systems is important to ensure that minimal substrate sliding or movement during transfer from a robotic end effector to wafer carrier shelves, pre-aligner vacuum chucks, load lock elevator shelves, process chamber transfer pins and/or pedestals. When a wafer slides against a support, particles may be scraped off that cause yield loss. Misplaced or misaligned components, even on the scale of fractions of a millimeter, can impact the cooperation of the various components within the semiconductor processing system, causing reduced product yield and/or quality.

This precise positioning must be achieved in initial manufacture, and must be maintained during system use. Component positioning can be altered because of normal wear, or as a result of procedures for maintenance, repair, alteration, or replacement. Accordingly, it becomes very important to automatically measure and compensate for relatively minute positional variations in the various components of a semiconductor processing system.

In the past, attempts have been made to provide substrate-like sensors in the form of a substrate, such as a wafer, which can be moved through the semiconductor processing system to wirelessly convey information such as substrate inclination and acceleration within the semiconductor system. As used herein, "substrate-like" is intended to mean a sensor in the form of substrate such as a semiconductor wafer, a Liquid Crystal Display glass panel or reticle. Attempts have been made to provide wireless substrate-like sensors that include additional types of detectors to allow the substrate-like sensor to measure a host of internal conditions within the processing environment of the semiconductor processing system. Wireless substrate-like sensors enable measurements to be made at various points throughout the processing equipment with reduced disruption of the internal environment as well as reduced disturbance of the substrate handling mechanisms and fabrication processes (e.g.: baking, etching, physical vapor deposition, chemical vapor deposition, coating, rinsing, drying etc.). For example, the wireless substrate-like sensor does not require that a vacuum chamber be vented or pumped down; nor does it pose any higher contamination risk to an ultra-clean environment than is suffered during actual processing. The wireless substrate-like sensor form factor enables measurements of process conditions with minimal observational uncertainty.

A dire need currently exists for systems that offer the benefits of wireless substrate-like sensors while facilitating the acquisition of and compensation for information related to positional variations of components within a semiconductor processing system. Although wireless substrate-like sensors currently provide limited information such as inclination and acceleration, they do not provide the required positional information. Technicians must still make subjective judgments to adjust the relative positions of the various components within the semiconductor processing system in order to ensure that such components cooperate to provide extremely careful substrate processing. Currently available sensors do not enable automatic adjustment of positional offsets between components of a semiconductor processing system.

SUMMARY OF THE INVENTION

A wireless substrate-like sensor is provided to facilitate alignment and calibration of semiconductor processing systems. The wireless substrate-like sensor includes an optical image acquisition system that acquires one or more images of targets or objects within the semiconductor processing system. Analysis of images of the targets obtained by the wireless substrate-like sensor provides useful information such as position, presence/absence, value and/or orientation in at least three degrees of freedom. An additional target can be affixed to a known location within the semiconductor processing system such that analyzing the reference position image with the wireless substrate-like sensor allows the measurement and compensation for pickup induced positional errors.

DETAILED DESCRIPTION OF THE PREFERRED EMBODIMENTS

While aspects the prior art have provided wireless substrate-like semiconductor sensors, the information provided by such sensors has been limited. To significantly facilitate semiconductor processing system alignment and calibration requires substantially more functionality than has been heretofore provided by wireless substrate-like sensors. Specifically, no wireless substrate-like sensors have provided information allowing calculation of very precise positions and orientations of components within the semiconductor processing system. This feature as well as many others will be apparent upon reading the discussion below.

Figure 1:
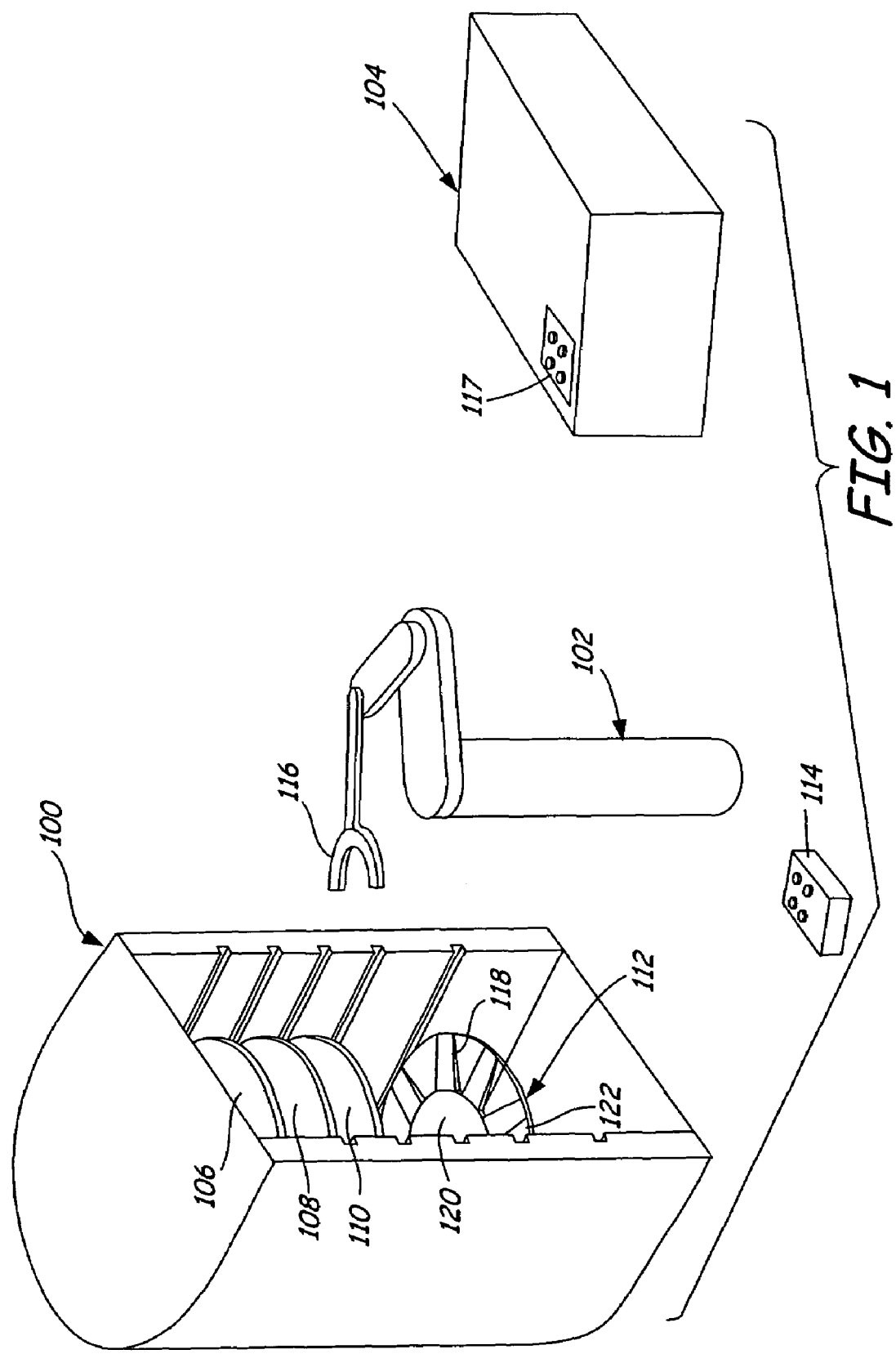
FIG. 1 is a diagrammatic view of a semiconductor wafer process environment.

FIG. 1 is a diagrammatic view of a semiconductor wafer processing environment including a wafer container 100, robot 102 and system component station 104 illustrated diagrammatically as simply a box. Wafer container 100 is illustrated containing three wafers 106, 108, 110 and wireless substrate-like sensor 112 in accordance with embodiments of the present invention. As is apparent from FIG. 1, sensor 112 is preferably embodied in a form factor allowing it to be moveable within the semiconductor wafer processing environment in the same manner as wafers themselves. Accordingly, embodiments of the present invention provide a substrate-like wireless sensor having a height low enough to permit the substrate-like sensor to move through the system as if it were a substrate such as a wafer. For example, a height of less than about 9.0 mm is believed to be acceptable. Preferably, the sensor has a weight of less than two wafers, for example, a weight of less than about 250 grams is believed to be acceptable. A stand-off distance of about 25 mm is believed to meet the requirements of most applications; however some applications may require a different stand-off. As used herein "stand-off" is the nominal distance from the bottom of the sensor to the target. The diameter of the sensor preferably matches one of the standard semiconductor wafer diameters, such as, 300 mm, 200 mm or 150 mm.

Sensor 112 is preferably constructed from dimensionally stable materials. In order for the substrate-like sensor to accurately measure a three-dimensional offset, it is important for the sensor to deform in a manner similar to that of an actual substrate. Common wafer dimensions and characteristics may be found in the following specification: SEMI M1-0302, "Specification for Polished Monocrystaline Silicon Wafers", Semiconductor Equipment and Materials International, www.semi.org. The center of a 300 mm silicon wafer supported at its edges will sag approximately 0.5 mm under its own weight. The difference in the deformation of the sensor and the deformation of an actual wafer should be much less than the accuracy of sensor measurement. In a preferred embodiment, the stiffness of the substrate-like sensor results in a deflection that is nearly identical to that of an actual silicon wafer. Therefore, no compensation is required to correct for any differential deflection. Alternatively, a compensation factor may be added to the measurement. Similarly, the weight of the substrate-like sensor will also deflect its support. Substrate supports include, but are not limited to: end effectors, pedestals, transfer pins, shelves, etc. The differential support deflection will be a function both of the difference in weights of the sensor and a substrate as well as the mechanical stiffness of the substrate support. The difference between deflection of the support by the sensor and that by a substrate should also be much less than the accuracy of sensor measurement, or the deflection difference should be compensated by a suitable calculation.

In the prior art, technicians have iteratively adjusted the alignment of a vacuum transfer robot end effector with a process chamber pedestal by viewing them after removing the lid of the process chamber or through a transparent window in the lid. Sometimes a snuggly fitting fixture or jig must first be placed on the process pedestal to provide a suitable reference mark. The substrate-like sensor enables an improved, technician assisted, alignment method. The substrate-like sensor provides an image of the objects being aligned without the step of removing the cover and with greater clarity than viewing through a window. The wireless substrate-like sensor saves significant time and improves the repeatability of alignment.

A wireless substrate-like sensor can transmit an analog camera image by radio.

A preferred embodiment uses a machine vision subsystem of a substrate-like wireless sensor to transmit all or a portion of the digital image stored in its memory to an external system for display or analysis. The external system can also be configured to store a number of such digital images. The display may be located near the receiver or the image data may be relayed through a data network for remote display. In a preferred embodiment, the camera image is transmitted encoded as a digital data stream to minimize degradation of image quality caused by communication channel noise. The digital image may be compressed using any of the well known data reduction methods in order to minimize the required data rate. The data rate may also be significantly reduced by transmitting only those portions of the image that have changed from the previous image. The substrate-like sensor or the display may overlay an electronic cross hair or other suitable mark to assist the technician with evaluating the alignment quality.

While vision-assisted teaching is more convenient than manual methods, technician judgment still affects the repeatability and reproducibility of alignment. The image acquired by a substrate-like wireless sensor camera may be analyzed using many well-known methods, including two-dimensional normalized correlation, to measure the offset of a pattern from its expected location. The pattern may be an arbitrary portion of an image that the vision system is trained to recognize. The pattern may be recorded by the system. The pattern may be mathematically described to the system. The mathematically described pattern may be fixed at time of manufacture or programmed at the point of use. Conventional two-dimensional normalized correlation is sensitive to changes in the pattern image size. When a simple lens system is used, magnification varies in proportion to object distance. Enhanced pattern offset measurement performance may be obtained by iteratively scaling either the image or the reference. The scale that results in the best correlation indicates the magnification, provided the size of the pattern is known, or the magnification, as used when the reference pattern was recorded, is known.

When the correspondence between pixels in the image plane to the size of pixels in the object plane is known, offsets may be reported in standard units of measure that are easier for technicians or machine controllers to interpret than arbitrary units such as pixels. For example, the offset may be provided in terms of millimeters such that the operator can simply adjust the systems by the reported amount. The computations required to obtain the offset in standard units may be performed manually, by an external computer, or preferentially within the sensor itself. When the sensor extracts the required information from an image, the minimum amount of information is transmitted and the minimum computational burden is placed on the technician or external controller. In this way objective criteria may be used to improve the repeatability and reproducibility of the alignment. Automated offset measurement improves the reproducibility of alignment by removing variation due to technician judgment.

During alignment and calibration of semiconductor processing equipment, it is not only important to correctly position an end effector relative to a second substrate supporting structure, it is also important to ensure that both substrate supporting structures are parallel to one another. In a preferred embodiment, a machine vision subsystem of a wireless substrate-like sensor is used to measure the three dimensional relationship between two substrate supports. For example: a robotic end effector may hold a wireless substrate-like sensor in close proximity to the transfer position and a measurement of the three dimensional offset with six degrees of freedom may be made from the sensor camera to a pattern located on an opposing substrate support. One set of six degrees of freedom includes yaw, pitch, and roll as well as displacement along the x, y, and z axes of the Cartesian coordinate system. However, those skilled in the art will appreciate that other coordinate systems may be used without departing from the spirit and scope of the invention. Simultaneous measurement of both parallelism and Cartesian offset allows a technician or a controller to objectively determine satisfactory alignment. When a controller is used, alignments that do not require technician intervention may be fully automated. Automated alignments may be incorporated into scheduled preventive maintenance routines that optimize system performance and availability.

In a very general sense, operation and automatic calibration of robotic system 102 is performed by instructing robot 102 to select and convey sensor 112 to reference target 114. Once instructed, robot 102 suitably actuates the various links to slide end effector 116 under sensor 112 to thereby remove sensor 112 from container 100. Once removed, robot 102 moves sensor 112 directly over reference target 114 to allow an optical image acquisition system (not shown in FIG. 1) within sensor 112 to obtain an image of reference target 114. Based upon a-priori knowledge of the target pattern, a three dimensional offset between the sensor and target 114 is measured. The measurement computation may occur within the sensor or an external computer. Based upon a-priori knowledge of the precise position and orientation of reference target 114, the three dimensional offset thereof can be analyzed to determine the pick-up error generated by robot 102 picking up sensor 112. Either internal or external computation allows the system to compensate for any error introduced by the pick-up process of sensor 112.

This information allows sensor 112 to be used to acquire images of additional targets, such as target 117 on system component 104 to calculate a precise position and orientation of system component 104. Repeating this process allows the controller of robot 102 to precisely map exact positions of all components within a semiconductor processing system. This mapping preferably generates location and orientation information in at least three and preferably six degrees of freedom (x, y, z, yaw, pitch and roll). The mapping information can be used by a technician to mechanically adjust the six degree of freedom location and orientation of any component with respect to that of any other component. Accurate measurements provided by the substrate-like wireless sensor are preferably used to minimize or reduce variability due to technician judgment. Preferably, this location information is reported to a robot or system controller which automates the calibration process. After all mechanical adjustments are complete; the substrate-like sensor may be used to measure the remaining alignment error. The six degrees of freedom offset measurement may be used to adjust the coordinates of points stored in the memories of the robot and/or system controllers. Such points include, but are not limited to: the position of an atmospheric substrate handling robot when an end effector is located at a FOUP slot #1 substrate transfer point; the position of an atmospheric substrate handling robot when an end effector is located at a FOUP slot #25 substrate transfer point; the position of an atmospheric substrate handling robot when an end effector is located at a substrate prealigner substrate transfer point; the position of an atmospheric substrate handling robot when an end effector is located at a load lock substrate transfer point; the position of an atmospheric substrate handling robot when an end effector is located at a reference target attached to the frame of an atmospheric substrate handling system; the position of a vacuum transfer robot when its end effector is located at a load lock substrate transfer point; the position of a vacuum transfer robot when an end effector is located at a process chamber substrate transfer point; and the position of a vacuum transfer robot when an end effector is located at a target attached to the frame of a vacuum transfer system.

An alternative embodiment of the present invention stores and reports the measurements. Real-time wireless communication may be impractical in some semiconductor processing systems. The structure of the system may interfere with wireless communication. Wireless communication energy may interfere with correct operation of a substrate processing system. In these cases, sensor 112 can preferably record values as it is conveyed to various targets, for later transmission to a host. When sensor 112, using its image acquisition system, or other suitable detectors, recognizes that it is no longer moving, sensor 112 preferably records the time and the value of the offset. At a later time, when sensor 112 is returned to its holster (shown in FIG. 6) sensor 112 can recall the stored times and values and transmit such information to the host. Such transmission may be accomplished by electrical conduction, optical signaling, inductive coupling or any other suitable means. Store and report operation of the wireless substrate-like sensor potentially: increases the reliability, lowers the cost and shortens a regulatory approval cycle for the system. Moreover, it avoids any possibility that the RF energy could interact with sensitive equipment in the neighborhood of the sensor and its holster. Store and report operation can also be used to overcome temporary interruptions of a real-time wireless communication channel.

Figure 2:
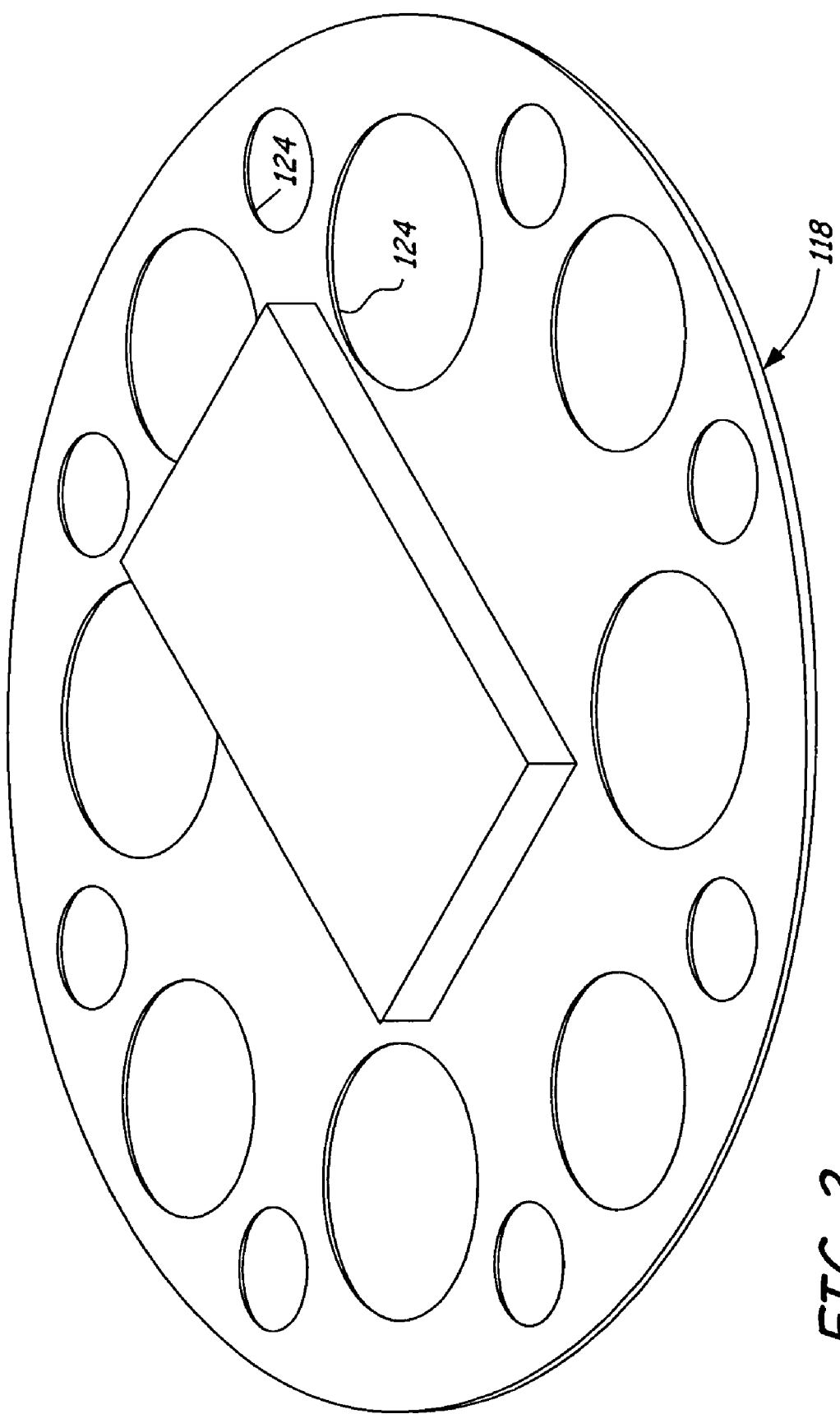
FIG. 2 is a top perspective view of a wireless substrate-like sensor in accordance with embodiments of the present invention.
Figure 3:
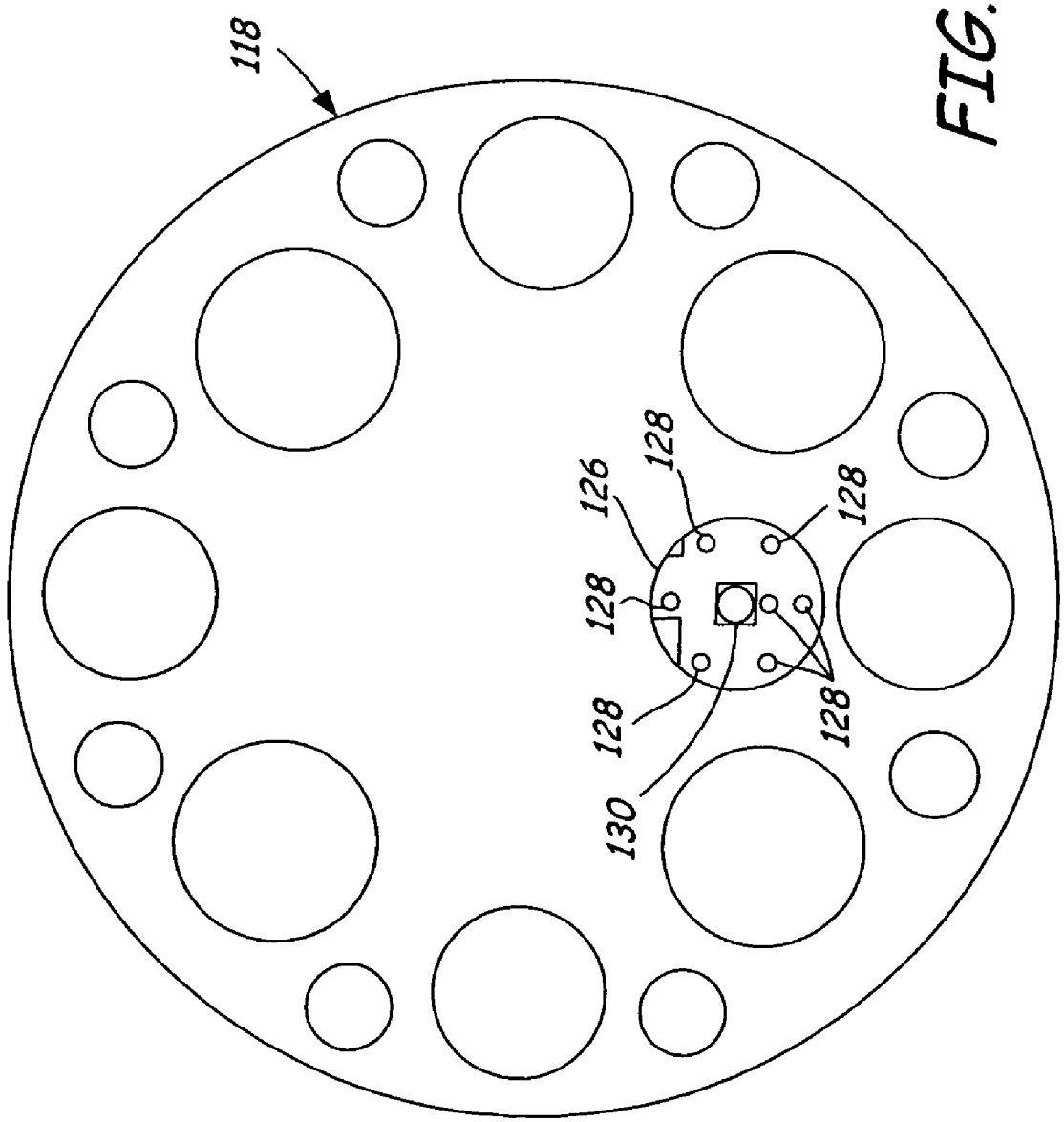
FIG. 3 is a bottom view of a wireless substrate-like sensor in accordance with embodiments of the present invention.

FIG. 2 is a top perspective view of a wireless substrate-like sensor 118 in accordance with embodiments of the present invention. Sensor 118 differs from sensor 112 illustrated in FIG. 1 solely in regard to the manner in which weight reduction is effected. Specifically, sensor 112 employs a number of struts 118 to suspend a central sensor portion 120 within an outer periphery 122 that can accommodate standard wafer sizes, such as 300 millimeter diameter wafers. In contrast, sensor 118 employs a number of through-holes 124 which also provide weight reduction to sensor 118. Other patterns of holes may be used to accomplish the necessary weight reduction. Additional weight reduction designs are also contemplated including, for example, portions of the sensor that are hollow, and/or portions that are filled with light-weight materials. Both sensor 112 and sensor 118 employ central region 120. A portion of the underside of central portion 120 is disposed directly over an access hole 126 as illustrated in FIG. 3. Access hole 126 allows illuminator 128 and image acquisition system 130 to acquire images of targets disposed below sensor 118 as sensor 118 is moved by robot 102.

Figure 4:
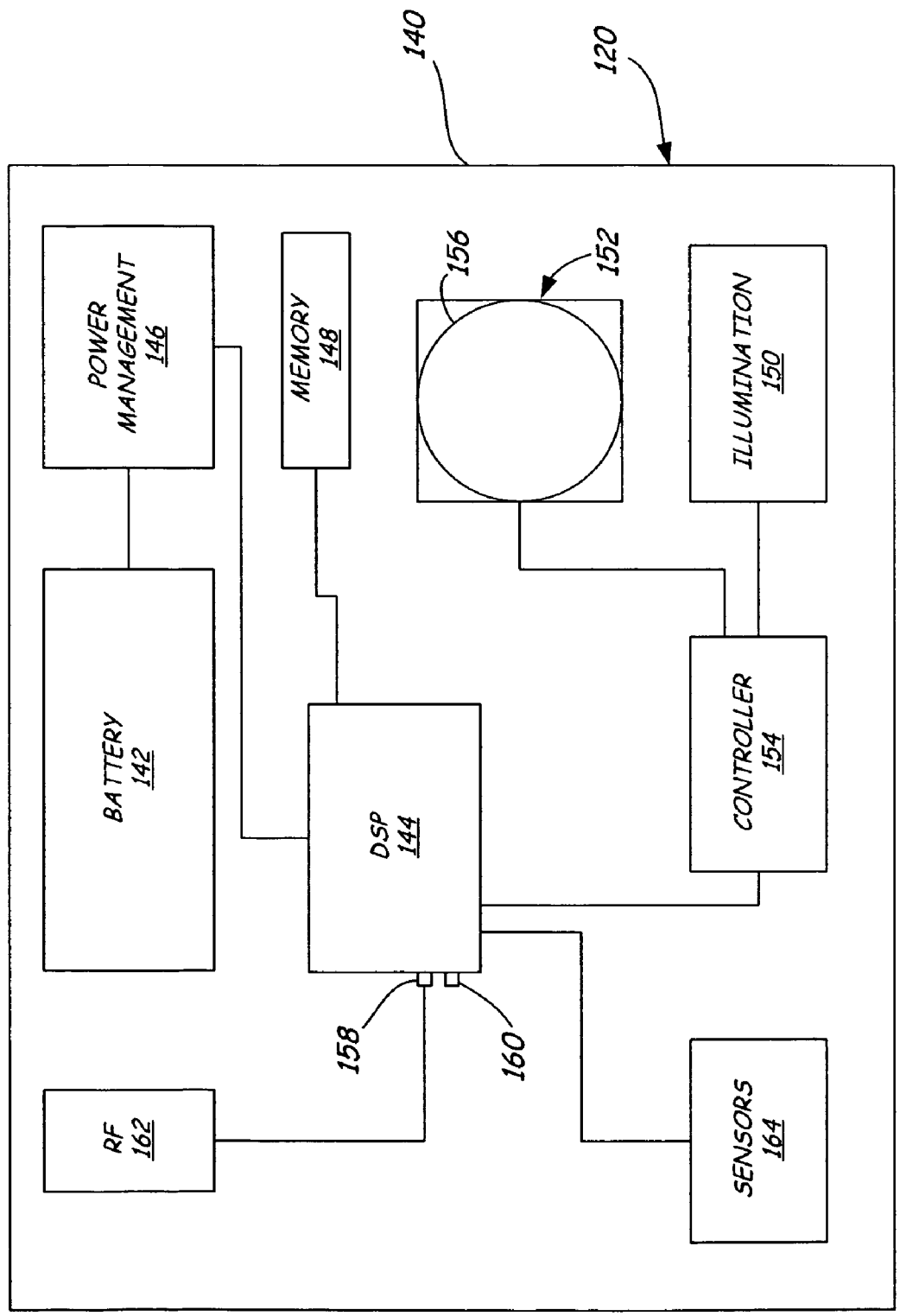
FIG. 4 is a diagrammatic view of central portion 120 in accordance with embodiments of the present invention.

FIG. 4 is a diagrammatic view of portion 120 in accordance with embodiments of the present invention. Portion 120 preferably includes a circuit board 140 upon which a number of components are mounted. Specifically, battery 142 is preferably mounted on circuit board 140 and coupled to digital signal processor (DSP) 144 via power management module 146. Power management module 146 ensures that proper voltage levels are provided to digital signal processor 144. Preferably, power management module 146 is a power management integrated circuit available from Texas Instrument under the trade designation TPS5602. Additionally, digital signal processor 144 is preferably a microprocessor available from Texas Instruments under the trade designation TMS320C6211. Digital signal processor 144 is coupled to memory module 148 which can take the form of any type of memory. Preferably, however, memory 148 includes a module of Synchronous Dynamic Random Access Memory (SDRAM) preferably having a size of 16M×16. Module 148 also preferably includes flash memory having a size of 256K×8. Flash memory is useful for storing such non-volatile data as programs, calibration data and/or additional other non-changing data as may be required. The random access memory is useful for storing volatile data such as acquired images or data relevant to program operation.

Illumination module 150, which preferably comprises a number of Light Emitting Diodes (LEDs), and image acquisition system 152 are coupled to digital signal processor 144 through camera controller 154. Camera controller 154 facilitates image acquisition and illumination thus providing relevant signaling to the LEDs and image acquisition system 152 as instructed by digital signal processor 144. Image acquisition system 152 preferably comprises an area array device such as a Charge Coupled Device (CCD) or Complementary Metal Oxide Semiconductor (CMOS) image device coupled preferably to an optical system 156, which focuses images upon the array. Preferably, the image acquisition device is available from Kodak under the trade designation KAC-0310. Digital signal processor 144 also preferably includes a number of I/O ports 158, 160. These ports are preferably serial ports that facilitate communication between digital signal processor 144 and additional devices. Specifically, serial port 158 is coupled to radio-frequency module 162 such that data sent through port 158 is coupled with external devices via radio frequency module 162. In one preferred embodiment, radio frequency module 162 operates in accordance with the well-known Bluetooth standard, Bluetooth Core Specification Version 1.1 (Feb. 22, 2001), available from the Bluetooth SIG (www.bluetooth.com). One example of module 162 is available from Mitsumi under the trade designation WML-C11.

Detectors 164 may take any suitable form and provide relevant information regarding any additional conditions within a semiconductor processing system. Such detectors can include one or more thermometers, accelerometers, inclinometers, compasses (Magnetic field direction detectors), light detectors, pressure detectors, electric field strength detectors, magnetic field strength detectors, acidity detectors, acoustic detectors, humidity detectors, chemical moiety activity detectors, or any other types of detector as may be appropriate.

Figure 5:
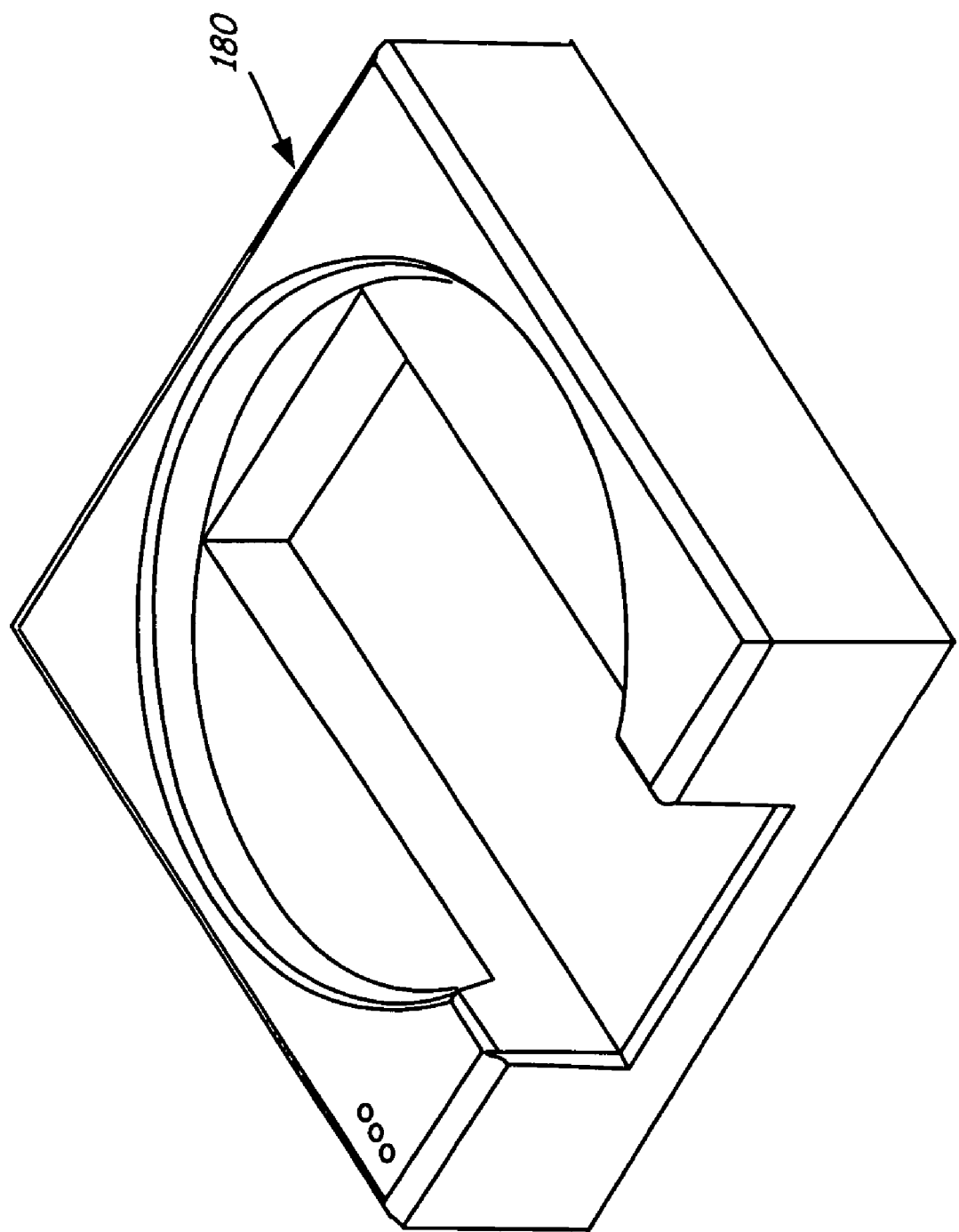
FIG. 5 is a top perspective view of a holster for maintaining a wireless substrate-like sensor in accordance with embodiments of the present invention.

FIG. 5 illustrates an optional holster 180 which can be used to store and maintain a wireless substrate-like sensor when such sensor is not in use. Holster 180 provides a convenient way to recharge the internal power storage device of the wireless sensor. Preferably, holster 180 includes suitable contacts to electrically couple to the wireless substrate-like sensor to thereby recharge the power source within the sensor. Such coupling can occur via any suitable methods including: inductive, photovoltaic, capacitive, and conductive methods.

Figure 6:
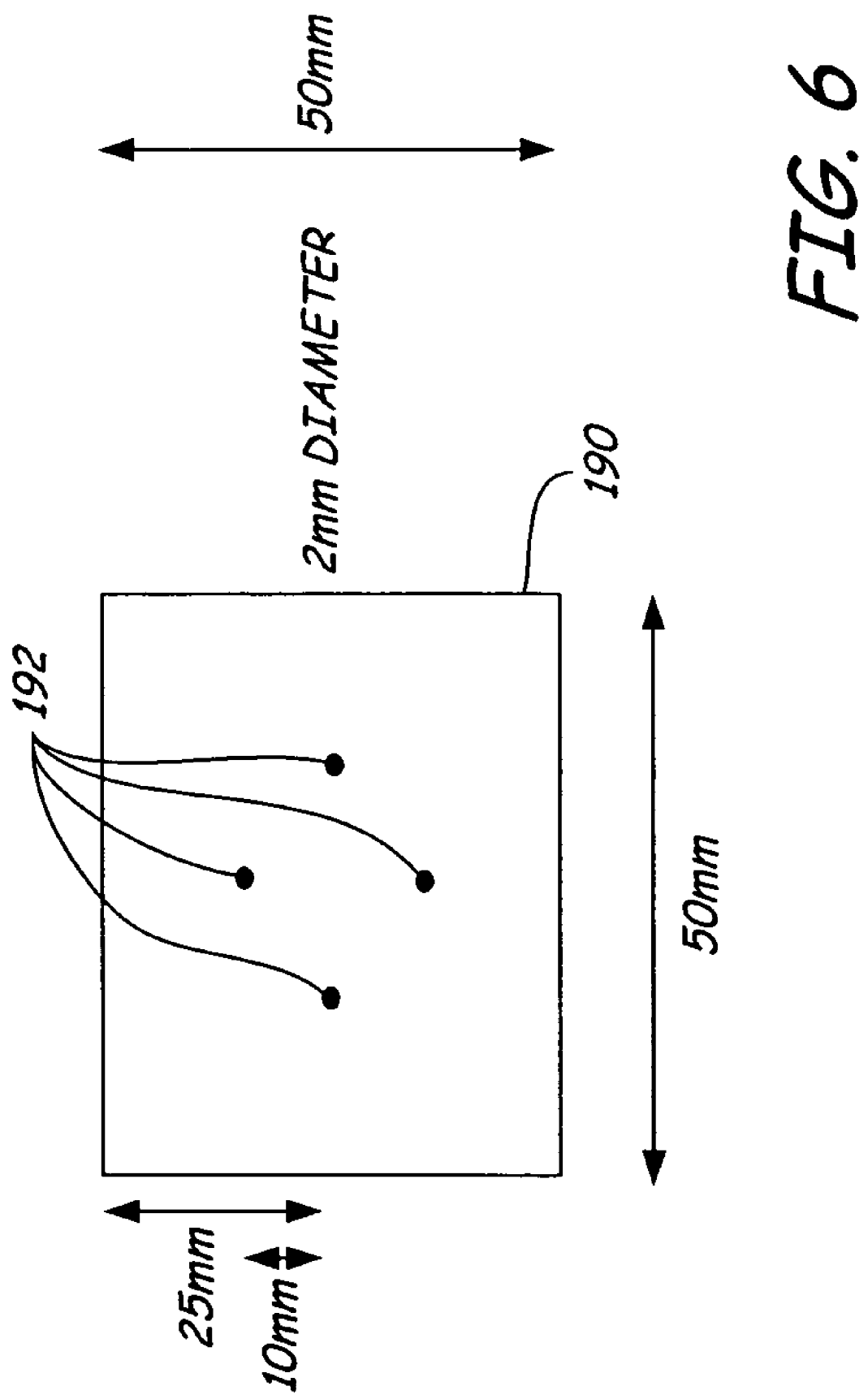
FIG. 6 is a top plan view of a target for use with embodiments of the present invention.

FIG. 6 is a diagrammatic view of a target useful with embodiments of the present invention. Important features of target 190 are that a visual target is provided having a known size and geometry such that an image thereof can be processed to calculate x, y, z positions, as well as yaw, pitch and roll. Such six-degree positional calculations have heretofore not been accommodated with wireless substrate-like sensors. Preferably, target 190 has a size of 50 mm×50 mm and includes four circular marks 192 which have a known size, geometry and positional relationship with respect to one another. Careful imaging and processing of target 190 can allow a system to calculate a vector to transform positions from that of the image acquisition system (wireless substrate-like sensor) to the target (semiconductor processing system component or reference marker).

Figure 7:
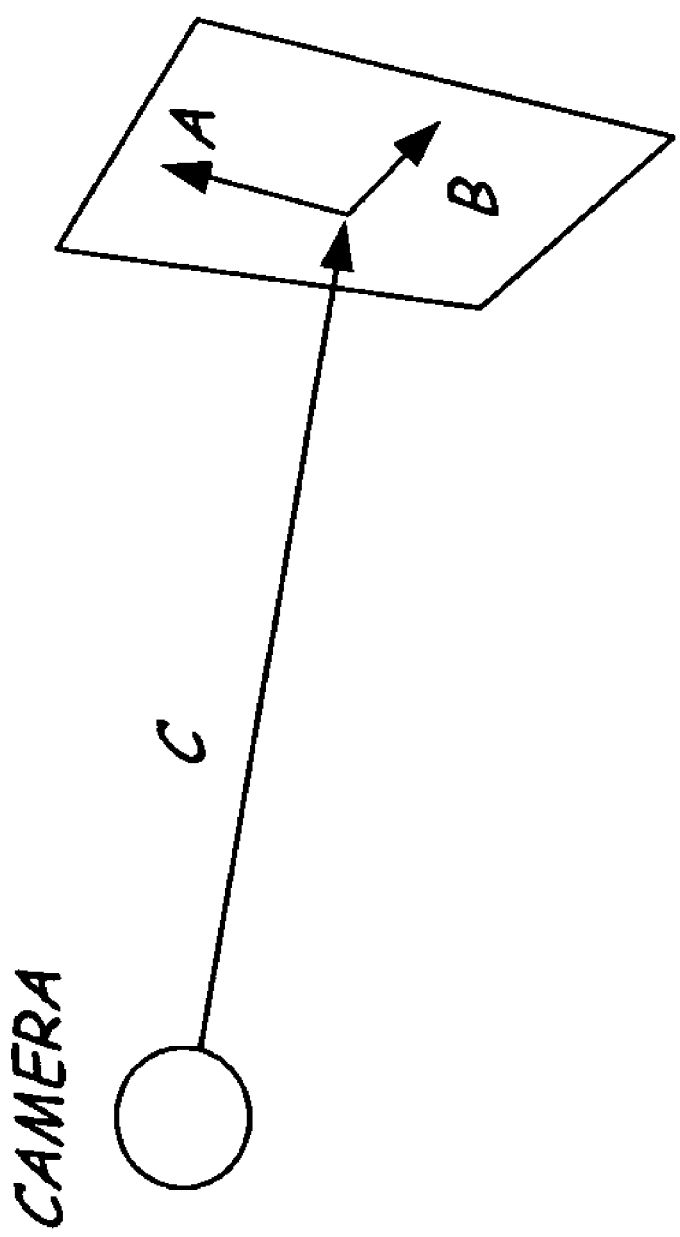
FIG. 7 is a diagrammatic view of a vector transformation in accordance with embodiments of the present invention.

For example, suppose the exact position of a flat surface in three dimensions must be found from a two-dimensional image of the surface taken by a camera. The position of the surface can be described by three vectors illustrated in FIG. 7 as follows: A and B are two vectors in the plane of the surface, which together describe the orientation of the surface. These can be thought of as axes of a local coordinate system on the surface. C is a vector from the image acquisition system to a reference point on the surface, which describes the position of the surface. (In fact C measures from a specific point inside the lens of the image acquisition system; the exact position of this point depends on the design of the image acquisition system.)

If the surface has some markings on it, such as indicia 192, a point in the marking pattern can be described in the surface coordinates by two numbers (u, v). The position of this point in three-dimensional space is then described by the vector equation:

$$P = C + u \cdot A + v \cdot B \qquad \text{EQ. 1}$$

The position (x, y) in the camera's image of this point is determined by the perspective transformation:

$$x = k \cdot P_x / P_z; \text{ and } y = k \cdot P_y / P_z$$

where k is a constant related to the field of view of the image acquisition system.

The relationship between the position of the mark on the surface and the position of the mark on the image can be obtained by combining these equations:

$$x \cdot (C_z + u \cdot A_z + v \cdot B_z) = k \cdot (C_x + u \cdot A_x + v \cdot B_x); \text{ and}$$

$$y \cdot (C_z + u \cdot A_z + v \cdot B_z) = k \cdot (C_y + u \cdot A_y + v \cdot B_y).$$

If a known pattern is used, u and v for each mark are known constants. Also, x and y for each mark can be measured from the image, and k can be determined by calibrating the camera.

One method of calibrating the camera is to image a mark at a known position relative to the camera, (Px, Py, Pz). If (x, y) is the position of the mark in the camera image, the camera magnification can be computed by either $$k = x \cdot Pz/Px,$$

or $$k = y \cdot Pz/Py.$$

More accurate values for k can be determined if necessary by making several measurements and using statistical techniques.

If a pattern with four marks, as illustrated in FIG. 6, is used, this results in a system of eight linear equations which can then be solved for these nine unknowns $$C_x, C_y, C_z, A_x, A_y, A_z, B_x, B_y \text{ and } B_z.$$

Once these nine values are known, the position and orientation in space of the surface can be computed. Because there are only eight equations and nine unknowns, one more constraint must be applied to find a unique solution. The lack of uniqueness exists because the same image will result from changing the system by any scaling factor—a large target will look exactly same to the image acquisition system as a small target close up. This can be seen in the equations by noting that multiplying all three vectors A, B, C by a constant does not change these equations. This means that the final constraint cannot be added by simply using five marks to get an additional three linear equations. Instead, a constraint on the size of the system should be used. The easiest constraint to chose is a constraint such as the absolute value |A|=1 which requires that the units used to measure u and v are the same as the units used on the vectors A, B, C.

The solution to these eight linear equations and one non-linear equation can be found for any particular pattern of markings (except for a few special cases such as all four marks in a straight line). The results can then be used in combination with simple image processing techniques to create a computer program which automatically calculates three-dimensional position and orientation of the surface from video images.

In summary, calculation of the position and orientation of target 190 is done by choosing a target with four easily found marks which can be attached to a surface of interest. Then, the method described above is employed and the chosen positions of the marks are used to create a system of eight equations in nine variables. Then, the system is solved to obtain expressions for eight of the nine components of the position vectors in terms of the ninth. For example, solve for A, B, and the x and y components of C in terms of $C_z$. The following steps are performed by the sensor each time it performs a measurement:

1) digitize an image of the target on the surface;
2) use standard image processing techniques such as blob analysis to find the reference marks in the image;
3) use the expressions described above to obtain eight components of the position vectors assuming the ninth is 1.0;
4) compute the length of A and divide all components by this length to produce correct values for the vectors A, B, C; and
5) optionally convert the results for the orientation vectors A and B to rotation angles and add an offset to C such that the position is reported relative to some reference point other than the lens of the image acquisition system. The method described above is an illustrative solution only, and it is contemplated that other approaches to finding the position of a surface using a two-dimensional image can be used without departing from the spirit and scope of the invention.

Although the present invention has been described with reference to preferred embodiments, workers skilled in the art will recognize that changes may be made in form and detail without departing from the spirit and scope of the invention. Although embodiments of the present invention have been described with respect to acquiring optical images of calibration targets and processing such images to ascertain position and orientation information in at least three degrees of freedom, additional optical features can be provided. For example, the wireless substrate-like sensor in some embodiments, is adapted to recognize characters and/or barcodes.

What is claimed is:

1. A wireless substrate-like sensor assembly used to perform calibration of a semiconductor processing system, the sensor assembly comprising:
   a wireless substrate-like sensor including:
      a processor;
      an internal power source; and
      an image acquisition system;
   a holster adapted to mechanically couple to the sensor to store the sensor when not in use;
   an automatic calibration target including:
      at least four target indicia, wherein the at least four target indicia are related to one another through a known relationship; and
      wherein the automatic calibration target is mountable to at least one station of the system; and
      wherein the sensor is adapted to provide location information relative to at least one automatic calibration target in at least two degrees of freedom.

2. The assembly of claim 1 additionally including an illumination source.

3. The system of claim 1 additionally including a wireless communication device.

4. The assembly of claim 1 wherein the processor is a digital signal processor.

5. The assembly of claim 1, wherein the sensor has a diameter of about 300 mm.

6. The assembly of claim 1, wherein the sensor has a diameter of about 200 mm.

7. The assembly of claim 1, wherein the sensor has a diameter of about 150 mm.

8. The assembly of claim 1, wherein the sensor has a diameter of about 450 mm.

9. The assembly of claim 1, wherein the sensor is adapted to provide location information relative to at least one automatic calibration target in at least three degrees of freedom.

10. The assembly of claim 1, wherein the sensor is adapted to provide location information relative to at least one automatic calibration target in at least six degrees of freedom.

11. The assembly of claim 1, wherein the sensor provides the location information to a technician.

12. The assembly of claim 1, wherein the sensor provides the location information to a system controller.

13. The assembly of claim 1, wherein the sensor provides the location information to a robot controller.

14. The assembly of claim 1, wherein the sensor is constructed from silicon.

15. The assembly of claim 1, wherein the holster charges the internal power source of the sensor when they are coupled together.

16. The assembly of claim 1, wherein the holster communicates with the sensor.

17. The assembly of claim 1, wherein each automatic calibration target includes a background with a high contrast to the indicia.

18. The assembly of claim 1 wherein the sensor records values for later transmission to a host and wherein, the sensor uses its image acquisition system to recognize when it is no longer moving and then records the time and the value of the offset.

19. The assembly of claim 1 wherein the sensor recognizes characters.

20. The assembly of claim 1 wherein the sensor recognizes bar codes.

* * * * *